United States Patent [19]

Sato

[11] Patent Number: 4,960,436
[45] Date of Patent: Oct. 2, 1990

[54] RADIATION OR LIGHT DETECTING SEMICONDUCTOR ELEMENT CONTAINING HEAVILY DOPED P-TYPE STOPPER REGION

[75] Inventor: Noritada Sato, Kanagawa, Japan

[73] Assignee: Fuji Electric Corporate Research & Development, Kanagawa, Japan

[21] Appl. No.: 698,616

[22] Filed: Feb. 6, 1985

Related U.S. Application Data

[62] Division of Ser. No. 528,077, Aug. 31, 1983, abandoned.

[30] Foreign Application Priority Data

Sep. 18, 1982 [JP] Japan .............................. 57-162838
Sep. 18, 1982 [JP] Japan .............................. 57-162839

[51] Int. Cl.$^5$ .............................................. H01L 31/18
[52] U.S. Cl. .............................................. 437/3; 357/30; 357/52
[58] Field of Search ................... 357/52, 30; 437/3, 75

[56] References Cited

U.S. PATENT DOCUMENTS

| | | | |
|---|---|---|---|
| 3,472,711 | 10/1969 | Chow | 148/186 |
| 3,601,668 | 8/1971 | Slater | 317/234 R |
| 4,090,213 | 5/1978 | Maserjian et al. | 357/30 |
| 4,343,962 | 8/1982 | Neugroschel et al. | 136/255 |
| 4,524,386 | 6/1985 | Cornick | 357/55 |

FOREIGN PATENT DOCUMENTS

136987 1/1978 Japan ................................... 357/30

*Primary Examiner*—Olik Chaudhuri
*Attorney, Agent, or Firm*—Brumbaugh, Graves, Donohue & Raymond

[57] ABSTRACT

A radiation or light detecting semiconductor element comprises a p-type monocrystalline silicon substrate having a high specific resistance of about 10,000 ohm-cm, a stopper layer formed in a part of a first principal surface of the substrate and diffused to provide a p-type conductivity material, an electrode diffusion layer of p$^+$ type material formed in at least part of the remaining part of the first principal surface not provided with the stopper layer, so as to be diffused into an n-type conductivity material, a metal (silicon) oxide layer formed on substantially the entire first principal substrate surface, a first aluminum electrode provided through the metal oxide layer and electrically connected to the electrode diffusion layer, and a second electrode of laminated Cr-Ni-Au deposited electrically conductively on a second principal surface of the substrate. A method for producing the element is also disclosed.

1 Claim, 6 Drawing Sheets

RADIATION OR LIGHT DETECTING SEMICONDUCTOR ELEMENT CONTAINING HEAVILY DOPED P-TYPE STOPPER REGION

This application is a division of application Ser. No. 528,077, filed on Aug. 31, 1983, now abandoned.

BACKGROUND OF THE INVENTION

This invention relates to a semiconductor element which is adapted for detecting radiation or light of a comparatively low energy level at a high sensitivity.

One radiation detecting semiconductor element according to the prior art consists of a surface-barrier type wherein a metal adapted to form a Schottky barrier is deposited on a semiconductor substrate. The metal adapted to form Schottky barrier may be gold for an n-type substrate, but may be aluminum for a p-type substrate. However, the mechanical strength of gold is comparatively low and thus tends to be easily stripped off the surface of the substrate, whereas aluminum exhibits comparatively low resistivity to ambient conditions and chemical corrosion. Particularly the radiation energy entering the depletion layer 5 through the silicon oxide layer 6 is maintained substantially at its original value, the radiation energy entering the depletion layer 5 through the electrode 3 and the diffusion layer 2 is partly reduced before entering the depletion layer. For this reason the measured radiation energy following the latter path is lower than the actual radiation energy.

Figure 2:
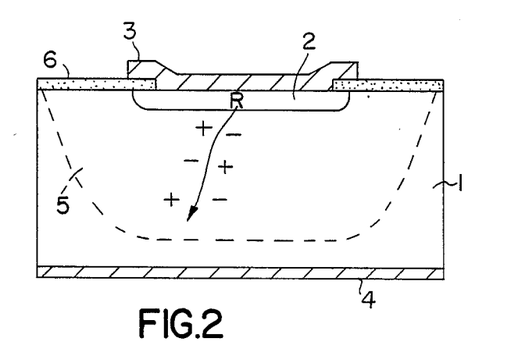
Figure 3:
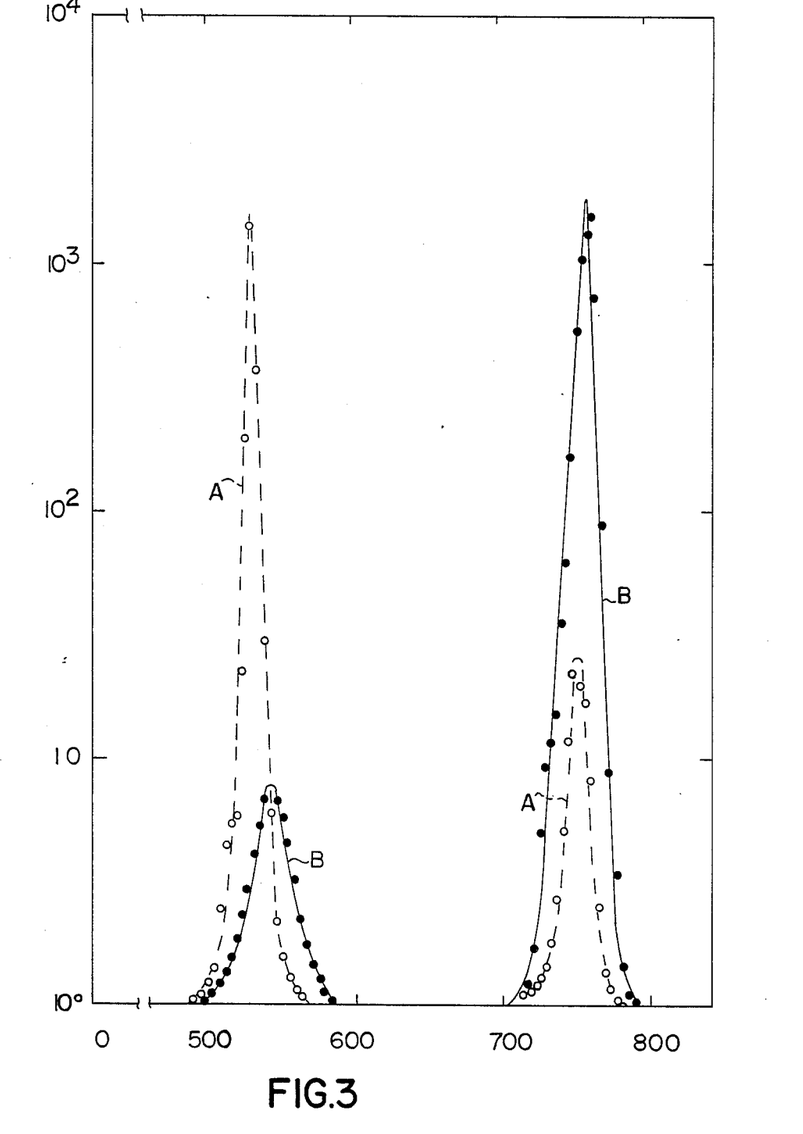
FIG. 3 is a graph showing spectral characteristics of a conventional p-n junction type detecting element and a detecting element produced in accordance with the production method of the present invention and having a construction as shown in FIG. 4, for the purpose of comparison.

FIG. 3 shows the measured results, with the abscissa representing the height of the pulse current delivered from the semiconductor element corresponding to the energy of each radiation, and with the ordinate representing the number of current pulses corresponding to the number of the radiation. A curve A in FIG. 3 indicates a case wherein $\alpha$ rays emitted from an isotope $^{241}$Am are measured by a planar element shown in FIG. 2. The peak values appearing on the right side in FIG. 3 correspond to energy levels inherent to the $\alpha$ rays, while the peak values on the left side of FIG. 3 correspond to the energy levels reduced by the electrode 3 and the diffusion layer 2. In the conventional planar type radiation detecting semiconductor element, an abnormal spectrum appears beside of the normal spectrum, and the number of the radiations corresponding to the abnormal spectrum frequently exceeds the number of radiations corresponding to the normal spectrum as shown in FIG. 3.

SUMMARY OF THE INVENTION

In view of the above described difficulties of the prior art, a primary object of the present invention is to when the radiation or light to be detected by the semiconductor element has a comparatively low energy, it is not preferable to totally enclose the semiconductor element in a metal casing because the radiation or light tends to be absorbed or reflected by the casing wall. For this reason, it would be advantageous to position the semiconductor element so that it is exposed only to outside light or radiation, or to encase the element in a simple package capable of avoiding absorption or reflection of radiant rays. In this case, however, the semiconductor element utilizing aluminum tends to be corroded by the oxygen in the air. In the aforementioned surface barrier type semiconductor element, the metal for providing the Schottky barrier is formed into a thickness less than 1000 Å for eliminating absorption of the radiant rays. This fact further accelerates oxygen corrosion, resulting in long term variation in the characteristics of the semiconductor element.

Figure 1:
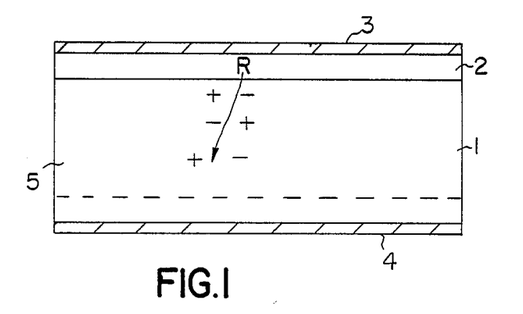
FIGS. 1 and 2 are cross-sectional views showing conventional p-n junction type semiconductor elements used for detecting radiation or light.

Another type of radiation or light detecting semiconductor elements having a p-n junction is shown in FIGS. 1 and 2, and comprises a silicon substrate 1 of a specific conductivity type, a diffusion layer 2 of a conductivity type reverse to that of the silicon substrate 1, and a p-n junction formed between the silicon substrate 1 and the diffusion layer 2. Under application of a reverse bias voltage across the p-n junction through electrodes 3 and 4, a depletion layer 5 is formed in a region partly extending in the diffusion layer 2 and mostly extending in the substrate 1. When a radiant ray R is guided into the depletion layer 5, charged couples are created as shown, and the movement of the charged couples creates a current pulse which is used for detecting the radiant ray in accordance with the principle of this type of semiconductor element. FIG. 1 shows a mesa type p-n junction semiconductor element, while FIG. 2 shows a planar type p-n junction semiconductor element, both of which are adapted for detecting radiation or light projecting into the elements. Numeral 6 in FIG. 2 designates a metal oxide layer, more specifically a silicon oxide layer.

Although the above described drawback of long term variation of the characteristics can be somewhat eliminated in the two p-n junction type semiconductor elements described above, the amount of radiation or light entering the depletion layer 5 is reduced by the metal electrode 3, thereby reducing sensitivity of the elements. Furthermore, in order to improve electric conductivity between the electrode 3 and the substrate 1, the diffusion layer 2 must be diffused with an impurity at a high density, which in turn restricts the expansion of the depletion layer 5 into the diffusion layer 2. Consequently, radiation or light which vanishes in the diffusion layer 2 does not contribute to the generation of the current pulse. For this reason, the diffusion layer for providing the p-n junction is essentially insensitive to such radiation or light, and therefore the sensitivity of the p-n junction type semiconductor elements is reduced.

Furthermore, for the purposes of providing the p-n junction in the junction type semiconductor elements, the impurity must be diffused at a temperature ranging from 800° to 1200° C. However, such a high temperature frequently creates an irregularity or defect in the crystal lattice of the semiconductor element. Since the life time of the charged couples created in the depletion layer 5 is thereby reduced, the sensitivity of the semiconductor element is further reduced. In this kind of semiconductor element, it is ordinarily necessary that the depletion layer be expanded sufficiently. However, if the defect or irregularity occurs in the p-n junction portion, even a relatively small defect tends to restrict the expansion of the depletion layer, and when the defect is relatively large, the leakage current in reverse direction tends to increase remarkably, thus rendering the semiconductor element inoperable.

When the mesa type junction element shown in FIG. 1 is compared with the planar type junction element shown in FIG. 2, the latter construction (wherein the radiant ray passing through the silicon oxide layer 6 is permitted to enter the depletion layer 5 directly), is found to be advantageous over the former construction (wherein the diffusion layer 2 and the electrode 3 cover the entire surface of the wafer 1), in that the insensitive area of the latter (FIG. 2) is less than that of the former construction (FIG. 1). However, as will be discussed below, the latter construction shown in FIG. 2 has less desirable energy spectral characteristics.

The radiation or light detecting semiconductor element is constructed so that the energy of the radiation entering the element is measured from the height of the current pulse delivered from the element, while the number of radiations is measured from the number of current pulses. For a planar type semiconductor element of FIG. 2, although provide a radiation or light detecting semiconductor element which is highly sensitive, eliminating the long term variation of the characteristics, and adapted for use in the measurement of radiations or light of a low energy level.

Another object of the invention is to provide a radiation or light detecting semiconductor element wherein the spectral characteristics of the element are substantially improved.

The above described object of the present invention is achieved by a radiation or light detecting semiconductor element comprising a silicon substrate of a first conductivity type having a high specific resistance, a stopper layer formed in a part of a first principal surface of the substrate and diffused to provide a first conductivity type, an electrode diffusion layer formed in the remaining part of the first principal surface of the substrate, not provided with the stopper layer, so as to be diffused into a second conductivity type reverse to the first conductivity type, a metal oxide layer formed on the first principal surface of the substrate such that the oxide layer covers the principal surface substantially entirely, a first electrode provided through the metal oxide layer and electrically connected to the electrode diffusion layer, and a second electrode deposited electrically conductively on a second principal surface of the substrate.

According to the present invention, the substrate is preferably made of a monocrystalline silicon having a high specific resistance capable of providing a depletion layer of a sufficient expansion within the semiconductor element. Preferably, the specific resistance is selected to be higher than 10,000 ohm-cm, preferably in the order of 20,000 ohm-cm. Although monocrystalline silicon of the above described specific resistance is commercially available, it is better to use a material produced from silane refined in its gas state by a molecular sieve. Such a material in crystalline state is also commercially available, and is advantageous in that not only is the specific resistance high, but also no impurity need be added in its crystal growing stage, which would cause a deformation or defect in the crystalline lattice. More specifically, in the semiconductor element according to the present invention, a defect in the crystalline lattice is avoided because no impurities are added which would disturb the depletion layer nearby the p-n junction. Accordingly, the above described material is substantially free from lattice defects.

In accordance with methods for forming the depletion layer which detects the radiation or light, a metal oxide layer such as a silicon oxide layer is deposited or grown on the high specific resistance wafer. The metal oxide layer produces an inversion layer in a surface region of the wafer immediately underlying the metal oxide. However, it has been considered that the inversion layer is not advantageous for the MOS type element, and various procedures have been proposed for preventing the creation of the inversion layer.

The applicants have discovered that where a metal oxide layer is utilized in combination with the above described high specific resistance wafer, the inversion layer produced directly underneath the metal oxide layer is capable of expanding the depletion layer within the bulk of the wafer and improving the radiation detecting property of the semiconductor element. According to the present invention, the inversion layer, instead of the p-n junction, is utilized positively for creating and expanding the depletion layer.

Although the advantage of the inversion layer has been ascertained through experiments, it is difficult to define the possible extent of expansion of the depletion layer by measurement. For this reason, the possible extent of depletion layer expansion will be described theoretically. It is well known that the expansion of the depletion layer is calculated using the following equation:

$$X_d = \left( \frac{2 K_s \epsilon_o (\phi_T + V_R)}{q N_a} \right)^{\frac{1}{2}}$$

wherein
$K_s$ = specific dielectric constant of the wafer,
$\epsilon_o$ = dielectric constant of vacuum,
$\phi_T$ = built-in potential,
$V_R$ = reverse bias voltage applied across the element,
$q$ = charge of electron, and
$N_a$ = density of acceptors in the wafer.

Herein
$\phi_T$ is expressed as $\phi_T = \phi_{FP} + \phi_{FN}$, where
$\phi_{FP}$ = Fermi potential of the wafer, and
$\phi_{FN}$ = Fermi potential of the inversion layer.

It is assumed that the specific resistance of the wafer is 20,000 ohm-cm, and it is estimated that the positive charges contained in the silicon oxide layer is $1 \times 10^{10}/cm^2$. Thus when $V_R = 0$, i.e. when no bias voltage is applied across the semiconductor element, $X_d$ is calculated to be 28 microns, and when $V_R = 20$ V, the expansion of the depletion layer $X_d$ is calculated to be 204 microns.

Considering $\alpha$ rays of $^{241}$Am as an example of the low energy radiations, since the depth of the depletion layer when no bias voltage is applied is shorter than the flying length or penetration depth (approx. 30 microns) of $\alpha$ rays, only a part of $\alpha$ rays contribute to the generation of pulse current. On the other hand, when a reverse bias voltage of 20 V is applied, the depth of the depletion layer increases to exceed the flying length or penetration depth of the $\alpha$ rays, and the entire energy of the $\alpha$ rays is allowed to contribute to the generation of pulse current.

When the positive charge in the metal oxide layer is scarce, the expansion of the depth of the depletion layer is reduced. However, when the positive charge in the metal oxide layer increases, for instance by ten times to $1 \times 10^{11}/cm^2$, the depth of the depletion layer increases to 31 microns even in a case where no reverse bias voltage is applied, so that the detected value by the semiconductor element is stabilized. Accordingly it is desirable that the density of the positive charge in the metal oxide layer is more than a predetermined value selected to be more than $1 \times 10^{11}/cm^2$ when rays are detected as described above. Accordingly, in the present invention, positive ions are injected into the metal oxide layer.

Since the invention utilizes a depletion layer formed in the silicon substrate of a high specific resistance by the inversion layer, a diffusion layer forming the p-n junction would not be considered necessary. However, since an electrode ohmically contacting with the substrate is required, one cannot eliminate a diffusion layer underlying the electrode. The location of the electrode and hence the diffusion layer underlying the electrode may be selected at any surface position of a part of the substrate in which the depletion layer is formed as described above, and the area of the diffusion layer is preferably minimized for reducing the insensitive region of the semiconductor element.

In the case where the inversion layer formed under the metal oxide layer extends to the periphery of the substrate, a short circuit path to the opposite electrode tends to be created along the side surface of the substrate. Thus when a bias voltage is applied to the element, a heavy leakage current tends to flow through the short circuit path, thereby deteriorating the S/N ratio of the semiconductor element. In order to prevent the extension of the inversion layer to the periphery of the substrate, it would be advantageous for the peripheral portion of the principal surface of the substrate covered by the metal oxide layer to be diffused with an impurity having a conductivity type the same as that of the substrate at a high density, so that another diffusion layer operable as a stopper layer is provided.

According to the method of producing the semiconductor element according to the present invention, the object can be achieved by performing the following steps, which comprise forming a diffusion layer of a heavily diffused p-type in a peripheral part of the principal surface of the silicon substrate exhibiting a weak p-type conductivity substantially equal to that of an intrinsic semiconductor, forming a diffusion layer of an n-type conductivity in the inner, non-peripheral part of the principal surface, forming a metal oxide layer on the principal surface of the substrate, injecting positive ions into the metal oxide layer after the completion of the oxide layer, forming an electrode on the principal surface such that the electrode penetrates the metal oxide layer to provide an ohmic contact with the n-type diffusion layer, and forming another electrode on the other principal surface of the substrate so that ohmic contact is provided between the other electrode and the substrate.

Other objects and advantages will become apparent from the detailed description, appended claims and accompanying drawings.

DETAILED DESCRIPTION OF THE PREFERRED EMBODIMENT

Figure 4:
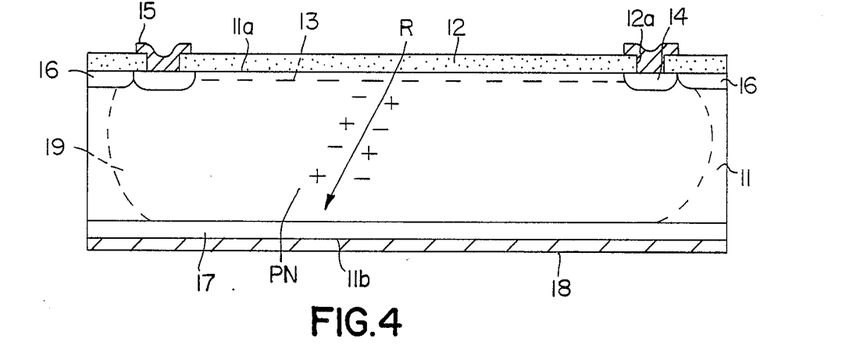
FIGS. 4 and 5 are cross-sectional views showing detecting elements of different constructions produced in accordance with the production method of the present invention.

A preferred embodiment of the present invention will now be described in detail with reference to the attached drawing. FIG. 4 shows, in a cross-sectional view, a radiation or light detecting semiconductor element having a silicon substrate 11 having a first conductivity type and a high specific resistance, which is made of, for instance, silane refined by a molecular sieve in its gas state thereby to provide a weak p-type conductivity and a specific resistance of about 20,000 ohm-cm. The substrate may be formed into a square or circular shape. Recently monocrystalline silicon material of the above described construction has become commercially available. This material is advantageous not only in its high specific resistance, but also in that it does not require any impurity to be added during its crystal growing state. Therefore, the possibility of causing a lattice defect or deformation can be minimized. More specifically in a semiconductor element adapted to be used in the present invention, creation of a faulty p-n junction due to the lattice defect and disturbance of the depletion layer produced nearby the p-n junction are not permissible, and hence the above described material having a minimum of lattice defect is preferable for the production of the semiconductor element.

The metal oxide layer 12, of silicon oxide for example, is deposited or grown on an upper surface 11a constituting one of the principal surfaces of the substrate 11, and an inversion layer 13 is induced in the substrate 11 below the metal oxide layer 12. In the embodiment shown, an electrode diffusion layer 14 of a second conductivity type is further provided to surround the inversion layer 13. The electrode diffusion layer 14 is formed by diffusing impurity through a hole 12a of a ring shape opened through the metal oxide layer 12. The layer 14 may be of an n+ layer when the substrate 11 is a weak p-type as described above. Furthermore, one electrode 15 of a ring shape is formed in accordance with a known method of, for instance, vapor depositing aluminum or the like through the hole 12a so that an ohmic contact is provided between the terminal 15 and the electrode diffusion layer 14. A stopper layer 16 of the same conductivity type (first conductivity type) as that of the substrate 11 on the principal surface 11a of the substrate 11 is further provided surrounding the ring-shaped electrode 15. When the substrate 11 is of a weak p-type conductivity as described above, the stopper layer 16 will be of a p+ type conductivity.

On the other principal surface (underside) 11b of the substrate 11, still another diffusion layer 17 is diffuseformed to the same conductivity type as that of the substrate 11, and another electrode 18 of the semiconductor element is deposited over the diffusion layer 17.

As is well known, the diffusion layer 17 is provided for improving the contact of the electrode 18 with the substrate 11. When the substrate 11 is of a weak p-type, the diffusion layer 17 may be of p+ type. The diffusion layer 17 may thus be diffused simultaneously with the stopper layer 16 of p+ type before the metal oxide layer 12 is formed on the substrate 11. The electrode 18 may be made of a lamination Cr-Ni-Au for the convenience of soldering the overall semiconductor element to a casing (not shown).

When the radiation or light is to be detected by the detecting element as described above, a reverse bias voltage of, for instance, 20 V DC shall be applied beforehand across the detecting element. Although a depletion layer of considerable size is formed in the bulk of the substrate 11 because of the inversion layer 13, the application of a reverse bias voltage is essential for the detection of the charged couples created by the individual radiations. Owing to the inversion layer 13 and the application of the reverse bias voltage a depletion layer 19 will expand in the bulk of the substrate 11 and reach the diffusion layer 17 on the other principal surface 11b as shown. When radiations or light R enter the detecting semiconductor element through the metal oxide layer 12, a radiation R having a large energy is absorbed in the depletion layer 19 thereby to generate secondary electrons. When the secondary electrons vanish, charged couples PN having positive and negative charges are created. On the other hand, when a radiation R of a low energy is received in the detecting element, charged couples PN are produced directly without following the production step of the secondary electrons. In either case, the charged couples produced are separately forced by an electric field existing in the depletion layer toward the electrodes 15 and 18. The movements of the electric charges are picked up in the circuit in the form of current pulses by applying a reverse bias voltage.

Figure 5:
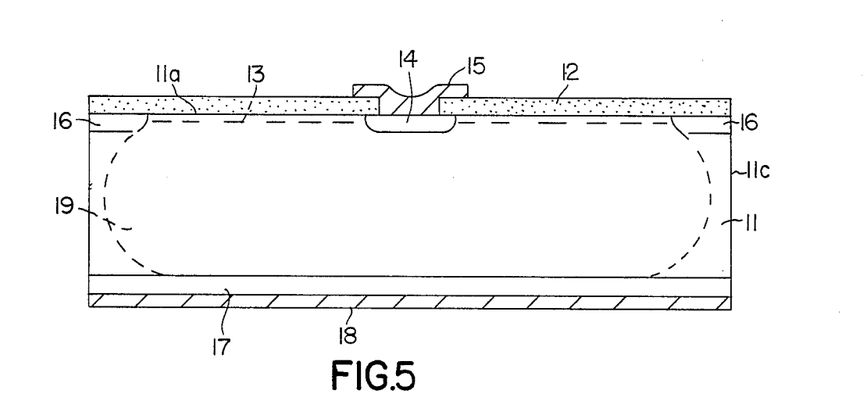

FIG. 5 illustrates another embodiment of the present invention, wherein similar parts as in FIG. 4 are designated by similar reference numerals. The embodiment of FIG. 5 differs from that of FIG. 4 in that the electrode diffusion layer 14 is a single circular deposit formed substantially at a central position of the principal surface 11a of the substrate 11 and the inversion layer 13 underlying the metal oxide layer 12. However, the stopper layer 16 is provided at the same position as in the embodiment shown in FIG. 4. That is, the stopper layer 16 is provided to surround the peripheral edge of the inversion layer 13. As will be easily understood from the above description, the surface areas of the electrode diffusion layer 14 and the electrode 15 in this embodiment are far smaller than those of the embodiment shown in FIG. 4, and therefore with this embodiment the portion which is insensitive to radiation or light is substantially reduced. The principle and the operation of this embodiment are similar to those of the embodiment shown in FIG. 4.

As for the metal oxide layer 12 used in the two embodiments, any one of layers such as an ordinary heat oxidized layer, CVD oxidized layer, oxide layer formed by a thermal decomposition of organic silane, and a composite layer formed by growing a nitride layer on a metal oxide layer may be utilized. In the case where the silicon substrate is of n-type, the oxide layer may be formed in such a manner that negative charges are reserved in the oxide layer. More specifically, the oxide layer is formed after the silicon substrate has been washed by a hydrogen peroxide solution containing ammonia for example. In this manner positive holes are induced in the surface portion of the silicon substrate under the metal oxide layer, so that a p-type inversion layer is formed on the surface of the n-type substrate.

FIGS. 6(a) through 6(f) illustrate a method for producing the semiconductor element according to the present invention, wherein the semiconductor element is constructed as shown in FIG. 4, and hence the members similar to those in FIG. 4 are designated by similar reference numerals.

Figure 6A:
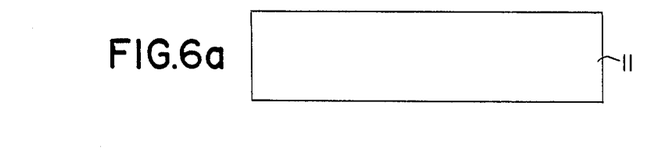
FIGS. 6(a) through 6(f) are cross-sectional diagrams showing the production method of the present invention.

In FIG. 6(a), numeral 11 designates a p-type silicon substrate having a high specific resistance, which is made of silane refined in its gas state by use of a molecular sieve and provided with a specific resistance of 20,000 ohm-cm and a weak p-type conductivity nearly equal to that of an intrinsic semiconductor.

Figure 6B:
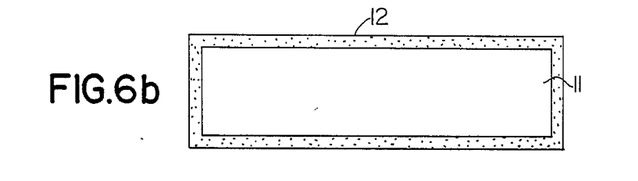

In a step shown in FIG. 6(b), an oxide layer 12 is heat-formed on the entire surface of the silicon substrate. Although various procedures such as CVD oxidizing or sputtering may be utilized for the production of the oxide layer 12, the heat-forming procedure has been described for the simplicity of the description. More specifically, the silicon substrate 11 obtained by the step FIG. 6(a) is cleaned and oxidized in a high-temperature oxidizing atmosphere of oxygen or steam. Although there is no restriction about the thickness of the oxide layer 12, a thickness of more than 0.5 micron is ordinarily selected.

Figure 6C:
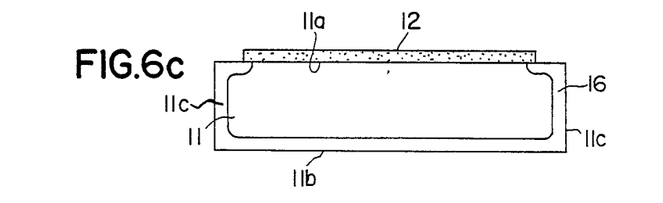

In a step shown in FIG. 6(c), all of the oxide layer 12 is removed by a conventional hot etching procedure for example from the peripheral portion of the first principal surface 11a, the entire portion of the second principal surface 11b, and from the entire portions on both side surfaces 11c, leaving only oxide layer 12 on the center of the principal surface 11a. After the removal of the oxide layer, a p+ type diffusion layer 16 is formed, for instance, by boron diffusion on the surface portions, where the oxide layer 12 has been removed. The p+ type diffusion layer 16 acts as a stopper layer on the first principal surface 11a, which prevents expansion of the inversion layer 13 toward the peripheral edge of the substrate 11, and also acts as an intermediate layer on the second principal surface 11b, which provides an ohmic contact with an electrode metal. Layer 16 need not be very thick, and the thickness is preferably several microns. The density of impurity in the layer 16 may also be selected to be an ordinary value adapted for providing an ordinary p+ layer. In the above described production step FIG. 6(c), the formation of the p+ layer on both side surfaces 11c may otherwise be eliminated for the simplicity of the production step.

Figure 6D:
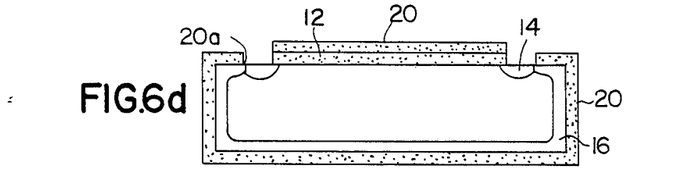

In a step of FIG. 6(d), an oxide layer 20, for masking purposes, is formed on the entire surfaces of the substrate 11 by a thermal oxidizing procedure for example. A window 20a of a ring-shape is then provided through the oxide layers 20 and 12 (when it is required) by a photo-etching procedure, and an impurity of phosphor or other material is diffused through the window 20b for providing an n+ layer 14 in the substrate 11. The diffusion layer 14 is electrically connected with the inversion layer 13 induced under the oxide layer 12, and serves to provide an ohmic contact with the electrode 15 subsequently deposited in the window 20a. The depth of the diffusion layer 14 is selected to be several microns, and the density of the impurity is selected to be an ordinary value adapted to provide an ordinary n+ diffusion layer. Although an oxide layer ordinarily contains positive ions in a range of $1\times 10^{10}$ to $1\times 10^{11}/cm^2$, such an amount of positive charge is insufficient to induce a strong inversion layer. Furthermore the charge density itself is spontaneously varied. From the view point of the quality control, the charge density must be increased more than a predetermined value and the spontaneous variation of the charge density must be restricted to a small range.

Figure 6E:
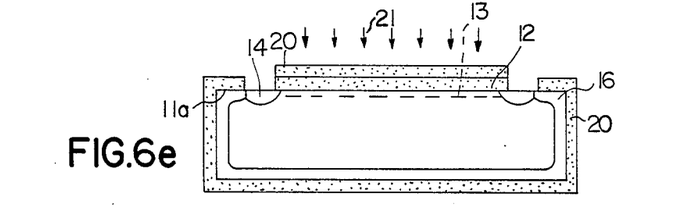

For this reason, in a step FIG. 6(e), positive charge 21 is further injected by an ion injecting procedure into the oxide layers 12 and 20 on the first principal surface 11a of the substrate 11. The ion injecting condition is selected so that then the thickness of the oxide layers is 0.5 microns, positive ions of boron or phosphor of about $1\times 10^{12}/cm^2$ are injected into the oxide layers 12 and 20 under application of an acceleration voltage of about 30 KeV. By the injection of the positive ions, the positive charge of a density sufficient to induce the inversion layer 13 to a desired thickness can be obtained in the oxide layers 12 and 20, and the spontaneous variation of the charge density can be thereby controlled to a desired range.

Figure 6F:
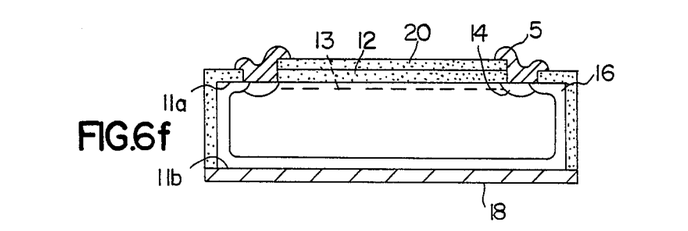

In the last step shown in FIG. 6(f), an electrode forming material such as aluminum is deposited on the first principal surface 11a by a vacuum deposition, and the thus deposited material is shaped as desired by an ordinary photoetching technique. In this manner the ohmic contact can be realized between the electrode 15 thus produced and the $n^+$ diffusion layer 14. The other electrode 18 on the second principal surface 11b of the substrate 11 may also be provided simultaneously with the electrode 15 by the vacuum deposition of aluminum vapor and the subsequent photo-etching procedure. Otherwise, a composite electrode layer consisting of Cr-Ni-Au may be deposited separately on the second principal surface of the substrate 11 so that the electrode 18 thus produced can be soldered advantageously when the element is mounted on a casing (not shown).

According to the present invention, since the radiation or light incident upon the radiation or light detecting semiconductor element is received in the depletion layer expanding in the substrate, through a metal oxide layer transparent to the radiation or light, the element can receive the radiation or light without substantial attenuation, and therefore the sensitivity of the semiconductor element can be improved in comparison with the conventional p-n junction type detecting element. Furthermore, since the size of the insensitive layer portion of the semiconductor element is much reduced compared to that of the conventional detecting element, the element according to this invention is highly advantageous for the measurement or detection of radiations such as X-rays, $\gamma$ rays, $\alpha$ rays, $\beta$ rays or light, all appearing in reduced energy levels. The metal oxide layer in the present invention is further useful as a stabilizing protection layer on the surface of the semiconductor element. By providing such a metal oxide layer, herebefore described difficulties of the thin metal layer of the surface barrier type detecting element, such as easily oxidized or deteriorated and long term variations in the characteristics of the detecting element, can be substantially eliminated.

When the metal oxide layer is selected suitably, and a composite layer as described above is utilized for the protection and the stabilization of the detecting element, the semiconductor detecting element of the present invention can be used in an exposed state to outside atmosphere without exhibiting any recognizable long term variation so long as the outside condition is not extraordinarily deleterious. In such a usage, since the casing tending to absorb radiations can be eliminated, the sensitivity of the detecting element can be further improved.

Curves B indicated in solid line in FIG. 3 show the measured results of $\alpha$ rays generated from an isotope $^{241}$Am by use of the detecting element shown in FIG. 4. One of the curves B (on the right side) exhibits a peak value of counted numbers of $\alpha$ rays correctly measured in the normal energy range of $\alpha$ rays, while the other curve (on the left side) exhibits a peak value of counted numbers of $\alpha$ rays received through the insensitive layer portion of the element and hence measured in an energy range different from the normal energy range of $\alpha$ rays. As will be apparent from FIG. 3, the values of the counted numbers in the normal energy range of $\alpha$ rays are, as compared to the case of the p-n junction type detecting element, far larger than the values of the counted numbers in the abnormal energy range of $\alpha$ rays. Such a fact indicates that the energy spectral characteristics of the detecting element has been improved remarkably from that of the conventional p-n junction type detecting element. For the embodiment shown in FIG. 5, since the area of the insensitive portion is further reduced from the embodiment of FIG. 4, the energy spectral characteristics of this embodiment is further improved. Furthermore, according to the present invention, positive charge has been ion-injected into the metal oxide layer as described hereinbefore. Consequently, the radiation or light detecting capability of the element is improved remarkably, and since the deviation among the products can be reduced, the productivity of the element can be much improved.

In the recent development of the production technique of semiconductors, the amount of positive charge reserved in the silicon oxide layer during the production of MOS type semiconductor elements has been reduced. Thus when it is desired to use the inversion layer created by the positive charge positively, the oxide layer produced by the recent technique barely creates the inversion layer under the oxide layer, and irregularities tend to occur in the degree of the creation and hence in the detecting characteristic of the semiconductor element.

Figure 7:
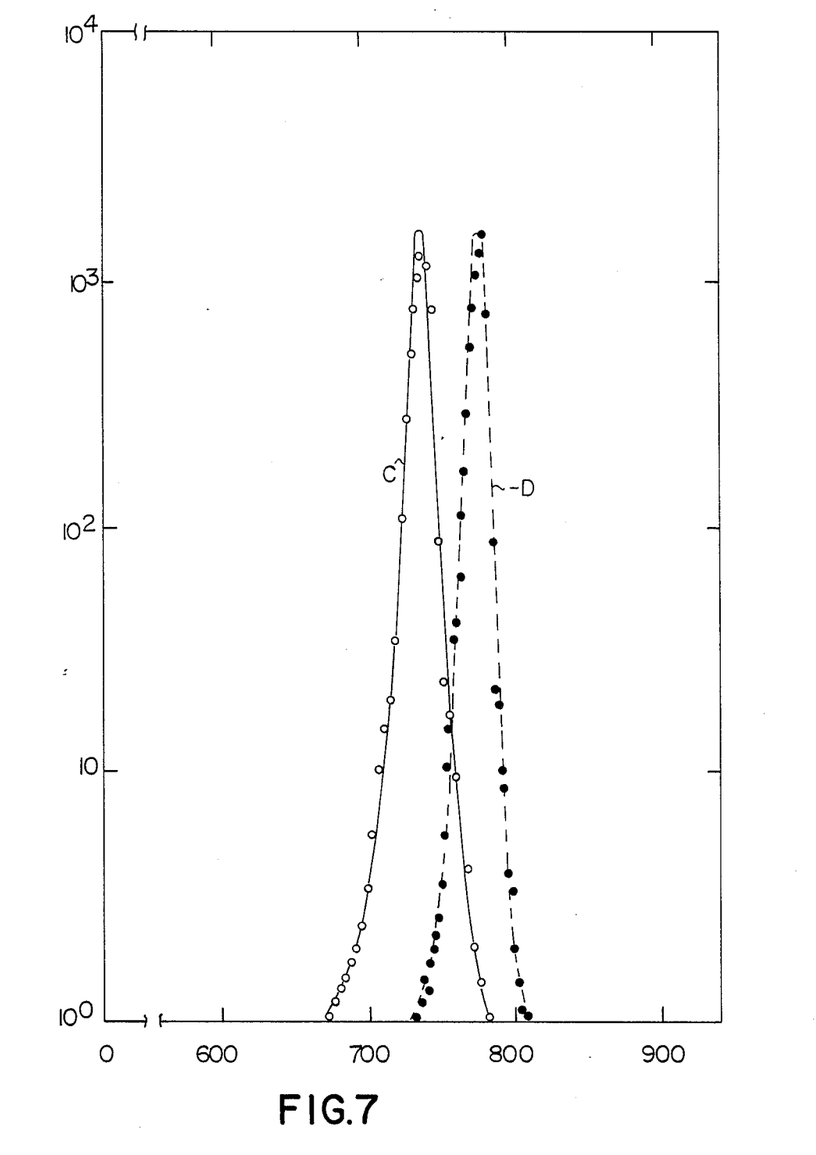
FIG. 7 is a graphical representation for indicating the difference of characteristics of a semiconductor element not subjected to ion-injection, in cases where no bias voltage and a bias voltage is applied.
Figure 8:
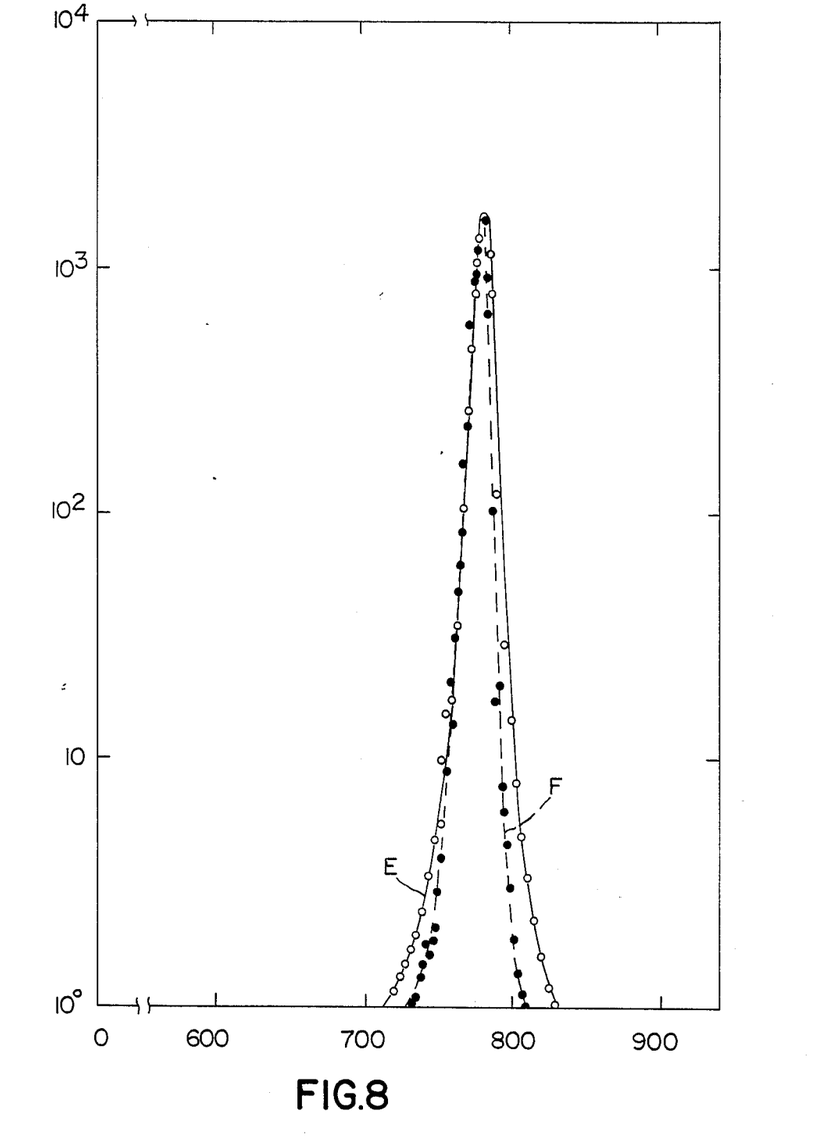
FIG. 8 is a graphical representation for indicating the difference of characteristics of a semiconductor element produced in accordance with the present invention, in cases where no bias voltage is applied, and where a bias voltage is applied.

FIG. 8 indicates detection characteristics of the semiconductor element of FIG. 4 produced with ion-injection of positive charge, which is exhibited at a time of the measurement of rays emitted from the isotope $^{241}$Am, and corresponds to that shown in FIG. 7. As is apparent from FIG. 8, the peak positions of a curve E corresponding to a case of no bias voltage and a curve F corresponding to a case having a bias voltage of 20 V, coincide with each other precisely. This fact reveals that a sufficient density of inversion layer has been induced under the oxide layer even in a case of no bias voltage, and that the depletion layer created within the bulk of the substrate expands more than the flying distance or penetration depth of rays of approximately 30 microns.

As described herein in detail, the radiation or light detecting semiconductor element according to the present invention exhibits far improved operational characteristics than those of the conventional surface-barrier type or p-n junction type semiconductor element, so that the semiconductor element according to the invention is particularly useful in the detection and the measurement of radiations or light arriving at a comparatively low energy. Furthermore, the production method according to the present invention permits the production of semiconductor elements having stable detection characteristics of the radiation or light at much improved productivity or yielding rate.

From the foregoing, it will be observed that numerous variations and modifications may be effected without departing from the true spirit and scope of the novel concept of the invention. It is to be understood that no limitation with respect to the specific embodiment illustrated here is intended or should be inferred. It is, of course, intended to cover by the appended claims all such modifications as fall within the scope of the claims.

We claim:

1. A method for producing a radiation or light detecting semiconductor element comprising a silicon substrate of a first conductivity type having a high specific resistance, a stopper layer formed in a part of a first principal surface of said substrate and diffused to provide a first conductivity type, an electrode diffusion layer formed in at least part of the remaining part of said first principal surface not provided with said stopper layer so as to be diffused into a second conductivity type reverse to the first conductivity type, a metal oxide layer formed on said first principal surface of said substrate such that the oxide layer covers said principal surface substantially entirely, a first electrode provided through said metal oxide layer and electrically connected to electrode diffusion layer, and a second electrode deposited electrically conductively on a second principal surface of said substrate, said method comprising:

forming a diffusion layer of a heavily diffused p-type in a peripheral part of the first principal surface of said silicon substrate that exhibits a weak p-type conductivity substantially equal to that of an intrinsic semiconductor;

forming a diffusion layer of an n-type conductivity in at least part of the remaining said first principal surface excluding said peripheral part;

forming a metal oxide layer on said first principal surface of said substrate;

injecting positive ions into said metal oxide layer after the completion of said metal oxide layer;

forming a first electrode on said first principal surface such that said first electrode penetrates said metal oxide layer to provide an ohmic contact with said n-type diffusion layer; and forming a second electrode on a second principal surface of said substrate so that ohmic contact is provided between the second electrode and said substrate.

* * * * *

UNITED STATES PATENT AND TRADEMARK OFFICE
CERTIFICATE OF CORRECTION

PATENT NO. : 4,960,436

DATED : October 2, 1990

INVENTOR(S) : Noritada Sato, et al

It is certified that error appears in the above-identified patent and that said Letters Patent is hereby corrected as shown below:

On the title page, 2nd col., 4th line, "1/1978" should read --11/1978--;

Column 1, line 54 (commencing with the word "when") through Column 3, line 12 (ending with the word "although") should have been printed at Column 1, line 23 (commencing after "Particularly").

Signed and Sealed this

Fifth Day of November, 1991

*Attest:*

HARRY F. MANBECK, JR.

*Attesting Officer*    *Commissioner of Patents and Trademarks*